United States Patent
Wouters

(10) Patent No.: US 6,825,788 B2
(45) Date of Patent: Nov. 30, 2004

(54) ANALOG-TO-DIGITAL AND DIGITAL-TO-ANALOG CONVERTER WITH STANDBY OUTPUT SIGNAL

(75) Inventor: Sietse Engelbregt Wouters, Cormondrèche (NL)

(73) Assignee: XEMICS SA, Neuchâtel (CH)

( * ) Notice: Subject to any disclaimer, the term of this patent is extended or adjusted under 35 U.S.C. 154(b) by 0 days.

(21) Appl. No.: 10/435,684

(22) Filed: May 12, 2003

(65) Prior Publication Data

US 2003/0234734 A1 Dec. 25, 2003

Related U.S. Application Data

(63) Continuation of application No. PCT/CH00/06600, filed on Nov. 10, 2000.

(51) Int. Cl.[7] ................................. H03M 1/10
(52) U.S. Cl. ....................... 341/155; 341/144
(58) Field of Search .................. 341/144, 155

(56) References Cited

U.S. PATENT DOCUMENTS 3,153,142 A * 10/1964 Hellerman ................. 341/165
4,454,500 A * 6/1984 Kato et al. ................. 341/108
5,886,658 A * 3/1999 Amar et al. ................ 341/155
6,075,478 A * 6/2000 Abe ........................... 341/155

FOREIGN PATENT DOCUMENTS

JP      11008595      12/1999

OTHER PUBLICATIONS

Analog Front–End of an ECBM Transceiver for ISDN, R. Castello et al., Custom Integrated Circuits Conference, (pp. 16.4.1–16.4.4) 1989 IEEE, XP–002173801.

* cited by examiner

Primary Examiner—Howard L. Williams
(74) Attorney, Agent, or Firm—Blank Rome LLP

(57) ABSTRACT

A codec having an analog-to-digital converter and is made in the form of a discrete electronic component. The codec has an analog-to-digital conversion circuit (14) for converting an analog input signal into a sequence of digital samples. An output stage (16) is provided for supplying said sequence in serial form outside said component (2). A first signal detection circuit (22, 24, 26, 28) is provided for indicating outside said component the presence or absence of significant data in said sequence.

51 Claims, 3 Drawing Sheets

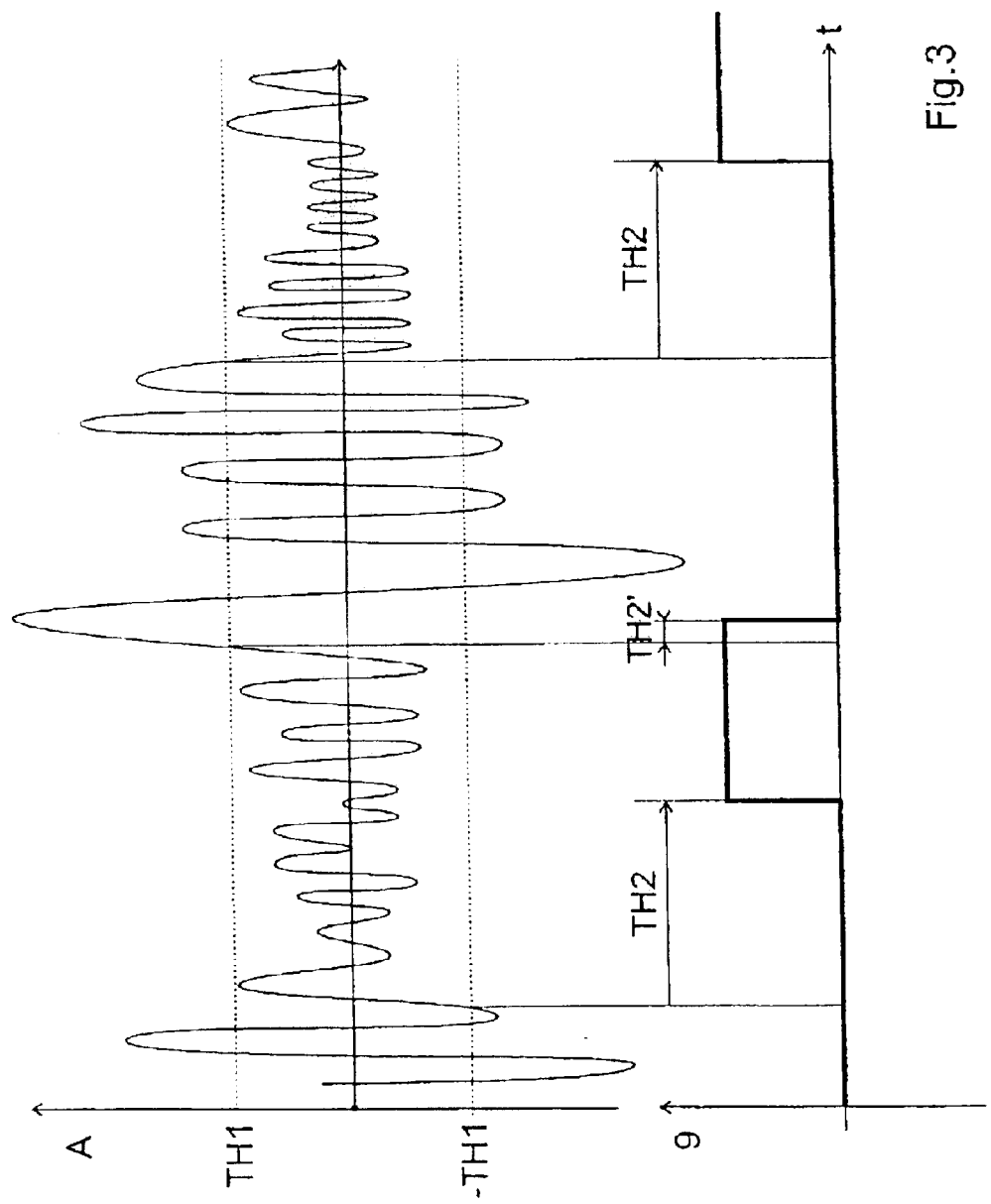

ANALOG-TO-DIGITAL AND DIGITAL-TO-ANALOG CONVERTER WITH STANDBY OUTPUT SIGNAL

RELATED APPLICATION

This application is a continuation of PCT application N° PCT/CH00/00600 (WO02/39588) filed Nov. 10, 2000, the content of which is hereby incorporated by reference.

BACKGROUND OF THE INVENTION

1. Field of the Invention

The present invention concerns an analog-to-digital and digital-to-analog converter or codec (encoder/decoder), in particular a converter made in the form of a discrete component. The present invention concerns notably a codec designed for the acquisition and restitution of voice signals in an electrically autonomous device.

2. Background of the Related Art

Many known apparatus require a voice signal acquisition and restitution system. By way of non-limiting examples, one can mention portable or cordless telephones, hearing aids, digital recording apparatus such as Dictaphones, voice-controlled apparatus, headphones, etc. These apparatus have in common an analog-to-digital conversion circuit capable of converting the analog signals supplied by a transducer, for example a microphone, into digital signals processed by a microprocessor or a signal processor (DSP). If the apparatus is designed to restitute sounds generated or processed by the processor, it also comprises a digital-to-analog conversion circuit for converting the microprocessor's digital signals into analog signals capable of driving a restitution element, for example a loudspeaker. It is known to integrate in a same discrete component the analog-to-digital conversion circuit and the digital-to-analog conversion circuit of an apparatus: this is called a codec (encoder/decoder).

In order to reduce the rate of the digital data at the output of the signal processor and thus to economize the pass-band of a transmission channel or the storage space of a data carrier, it is already known to make or program the microprocessor so that it interrupts the signal processing when no voice signal is picked up by the microphone. It has in fact been observed in a typical telephony application that the speaking time of each interlocutor is less than 50% of the total communication time. This characteristic of speech signals has been used for compressing the transmitted digital data.

For this purpose, signal processors are known that comprise a circuit or computer module allowing the presence or absence of voice to be detected and the transmission or storing of the data to be interrupted in the absence of voice.

The signal processor must however remain permanently powered in order to effect this detection, which proves particularly disadvantageous in a device having a low electrical autonomy. Furthermore, most of the processors commercially available on the market are not provided with a voice detection circuit, which considerably restricts the choice of available processors that can be used for a given application or requires this function to be realized by programming it on an existing microprocessor. A voice detection module realized by a software must however process the data from the codec in real time and therefore strongly burdens the microprocessor's memory and its computational capacity.

Circuits are also known that are made in the form of discrete components that supply a signal indicating the absence or presence of voice in a flux of analog or digital data. The algorithms and the circuits used in this type of specialized circuits are however complex and allow notably to distinguish between a silence, a voice or a noise, for example by measuring the energy or power levels in one or several frequency bands. Such circuits are thus relatively expensive, complex to use and have a high electricity consumption. Furthermore, the presence of an additional discrete electronic circuit between the codec and the microprocessor is often undesirable in miniaturized portable devices. Finally, these circuits are not adapted for processing digital signals transmitted serially between the codec and the digital processor.

It is therefore an aim of the present invention to avoid the aforementioned disadvantages.

SUMMARY OF THE INVENTION

According to the invention, these aims are achieved by means of an analog-to-digital and/or digital-to-analog converter having the characteristics of the independent claims, preferred embodiments being furthermore mentioned in the dependent claims.

In particular, these aims are achieved by means of an analog-to-digital converter made in the form of a discrete electronic component, comprising notably a signal detection circuit for detecting and indicating outside the component the presence or absence of significant data in the sequence of digital samples generated by the conversion circuit.

By integrating the signal detection circuit into the analog-to-digital converter rather than into the signal processor, it is thus possible to generate a standby-mode signal that can be used for selectively deactivating the components downstream of the converter, notably the processor itself. This solution furthermore allows the signal detection circuit to process the converted data digitally and in parallel; it is thus possible to make a very simple circuit, requiring only a small silicon surface and having a reduced electrical consumption.

The signal detection circuit can for example comprise a digital comparator for comparing each sample of the digital sequence with a threshold value. Such a comparator can be made with very reduced surface requirements. In order to avoid overly quick variations of the standby-mode signal, an accumulator is preferably provided for integrating the signal at the output of the digital comparator. Such an accumulator can be made economically by means of a simple counter.

The aims of the invention are also achieved by means of an analog-to-digital converter made in the form of a discrete electronic component, comprising notably a signal detection circuit for detecting and indicating outside the component the presence or absence of significant data in the sequence of digital samples received.

BRIEF DESCRIPTION OF THE FIGURES

The invention will be better understood by reading the description given by way of example and illustrated by the attached drawings in which:

FIG. 3 shows different timing diagrams illustrating the evolution of the signals in the inventive system.

DETAILED DESCRIPTION OF THE INVENTION

Figure 1:
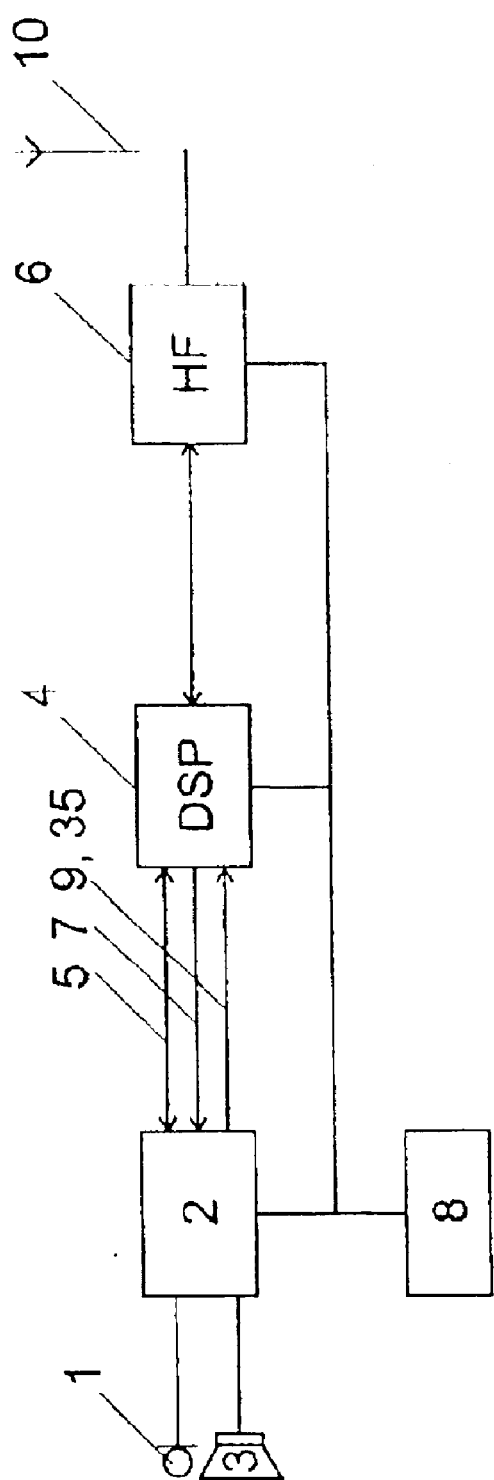
FIG. 1 shows an acquisition, processing and restitution system for audio data, comprising a codec, a processor and a high-frequency module.

FIG. 1 shows diagrammatically a system using a codec 2 according to the invention. The codec 2 allows to acquire and digitize analog data coming from a transducer 1, for example a microphone, and to convert digital signals into analog signals capable of being restituted by a loudspeaker 3. The codec 2 exchanges digital audio data through a serial audio line 5 with a processor 4, for example a signal processor or a micro-controller. The behavior of the codec 2 can be controlled by the processor by means of a serial control line 7. Standby-mode signals 9, 35 supplied by the codec 2 to the microprocessor 4 allow the latter to selectively put certain components of the system in standby mode, as will be seen further below.

The data acquired by the microphone 1 and digitized by the codec 2 are processed by the processor 4, for example to filter them, store them, detect particular events, etc., and can be transmitted by a communication module 6 through a communication channel, in the illustrated example a radio channel using an antenna 10. Inversely, the data received by the module 6 can be processed by the processor 4 and converted to analog signals by the codec 2 in order to be restituted in the form of voice signals by the loudspeaker 3. The whole system is powered by means of a battery or of a cell 8. The codec 2, the microprocessor 4 and the communication module 6 are preferably made in the form of discrete components (integrated circuits) mounted for example onto a printed circuit board (under exclusion of the high-frequency part). The system can include other components.

Figure 2:
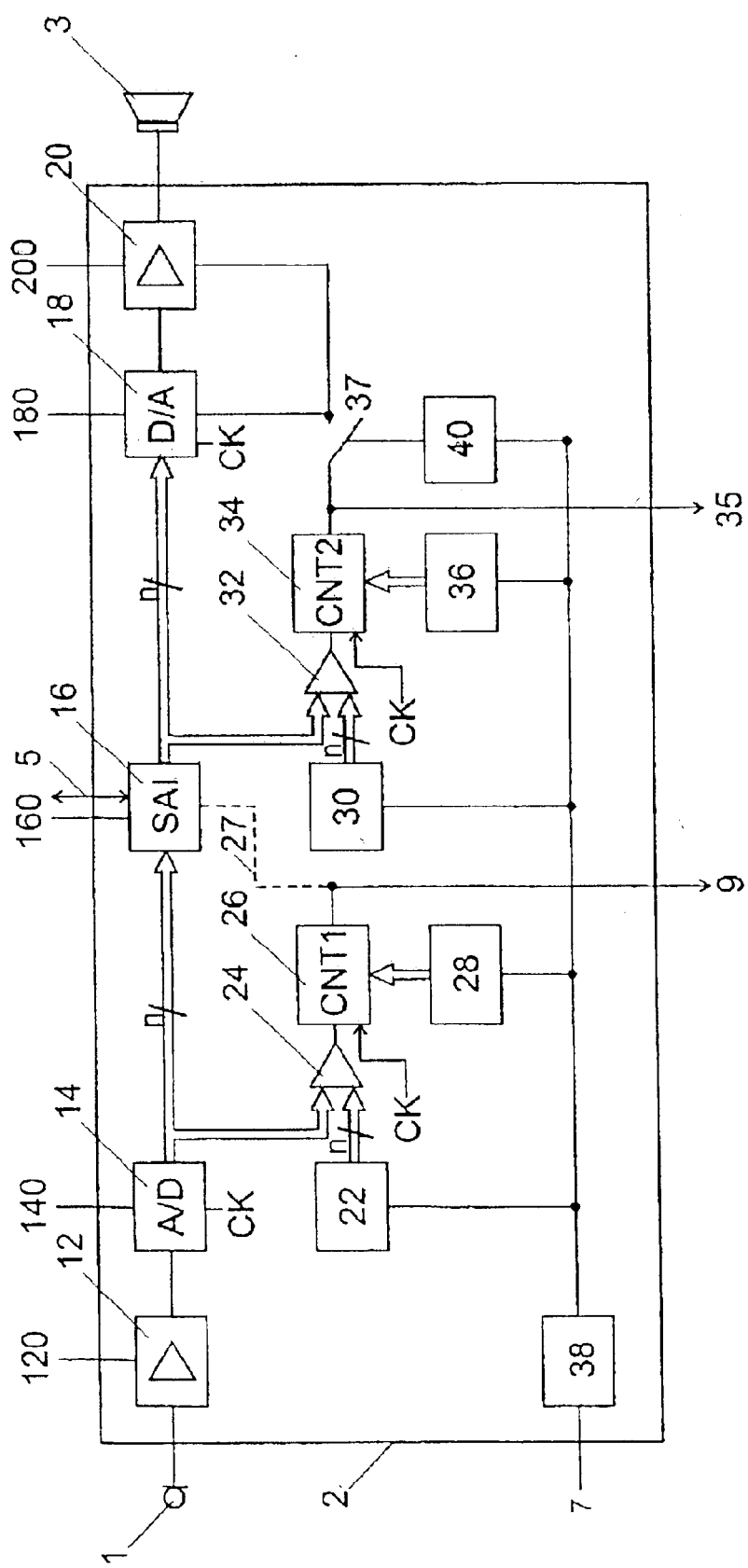
FIG. 2 shows an analog-to-digital and digital-to-analog converter according to the invention.

The codec 2 is illustrated in more detail in FIG. 2. The analog signal supplied for example by the microphone 1 is amplified by an amplification stage 12 and then converted into a sequence of digital samples at n bits by the conventional analog-to-digital converter 14. A clock signal CK supplied by a not-represented clock circuit determines the sampling times of the converter 14. The n bits of each sample are supplied in parallel, at each sampling time, to a serial audio interface 16 that converts them into a serial signal on an external line 5 according to a predefined protocol, for example according to the IIS protocol. The operation of the serial audio interface 16 as well as the parameters for the serial transmission can be defined by means of not-represented registers accessible from outside the circuit 2.

According to the invention, the codec 2 further comprises a first comparator 24 for comparing the digital samples supplied by the converter 14 with a first threshold value TH1 stored in a first register 22. A first counter 26 is incremented each time the output of the comparator 24 is active, i.e. when the digital sample is lower than the predetermined threshold value TH1 in the register 22. The output 9 of the first counter 26 is a standby-mode signal that is active when the counted value is greater than a second threshold value TH2 stored in a second register 28. The counter 26 is reset to zero (or reinitialized to another predefined value) when the codec 2 is turned on and when the output of the comparator 24 is inactive, i.e. when the input signal is greater than TH1. The signal 9 at the output of the counter 26 is thus at an inactive level when the system is turned on and switches to an active level when consecutive TH2 digital samples are lower to the threshold value TH1. The signal 9 thus allows to indicate the presence or absence of voice in the analog signal received from the microphone and can be used outside the codec 2 to put other components of the system, for example the processor 4 and/or the communication module 6, in standby mode as soon as the analog input signal is lower during TH2 intervals to the threshold TH1. As indicated by the broken line 27, it is also possible in a variant embodiment of the invention to automatically deactivate the serial audio interface 16 when the standby-mode signal 9 is in an active state.

In a preferred embodiment of the invention, the standby-mode signal 9 is connected directly with an interruption line of the microprocessor 4. A software routine executed by the microprocessor 4 detects any change of the logical state of the interruption line and reacts when the latter is at an active level by putting all or part of the microprocessor 4 as well as preferably other components of the system, for example the communication module 6 or certain elements of the codec 2, in standby mode. It is however also possible to interrupt directly the feeding of one or several components 4, 6 when the standby-mode signal 9 is active, at the risk however of brutally interrupting certain routines executed by the processor.

The codec 2 further comprises a digital-to-analog conversion circuit for converting a sequence of digital data received on the serial interface 5 into an analog signal capable of commanding for example a loudspeaker 3. The serial digital signal is converted, for example according to the IIS protocol, by the serial audio interface 16 into a sequence of words of n bits supplied to a digital-to-analog converter 18. The analog output of the converter 18 is amplified and possibly filtered by an amplifier 20 allowing to drive the loudspeaker 3. The gain of the amplifier 20 can preferably be controlled by means of a not-represented register accessible from outside the codec 2.

According to the invention, the codec 2 further comprises a second comparator 32 for comparing the words of n bits supplied by the interface 16 with a third threshold value TH3 stored in a second register 30. A second counter 34 is incremented each time the output of the comparator 32 is active, i.e. when the digital word received is lower than the predetermined threshold value TH3 in the register 30. The output 35 of the second counter 34 is active when the value in the counter is greater than a fourth threshold value TH4 stored in a fourth register 36. The counter 34 is reset to zero (or reinitialized to another predefined value) when the codec 2 is switched on and when the output of the comparator 32 is inactive, i.e. when the received word is greater than TH3. The signal 35 at the output of the counter 34 is a second standby-modus signal which is at an inactive level when the system is switched on and switches to an active level when the received word is lower than the threshold value TH3 during TH4 consecutive sampling times. This signal thus allows to indicate the presence or absence of voice in the digital signal received and can be used outside the codec 2 to put other components of the system, for example the processor 4 and/or the communication module 6, in standby mode as soon as the digital input signal is lower during TH4 intervals to the threshold TH3. According to the invention, this signal 35 can also be used for deactivating directly the codec's components downstream of the interface 16, in particular the digital-to-analog converter 18 and the amplifier 20. A switch 37 controlled by a register or a sweep circuit 40 accessible from outside the circuit 2 allows to interrupt the direct connection of the signal 35 with the components 18, 20 and to prevent or authorize the automatic switch to standby mode of these components by the counter 34.

The contents of the registers 22, 28, 30, 36 and 40 defining the mentioned threshold values, as well as other registers allowing for instance the operation of the serial audio interface 16 or the gain/increase of the amplifiers 12, 20 to be parametered, can be modified from outside the circuit 2 through a serial interface controller 38. The processor 4 can thus adjust the thresholds of the comparators 22, 32 and of the counters 26, 34 by communicating over the serial line 7 with the controller 38.

At least certain components of the codec 2 can preferably be put in standby mode by the micro-controller 4, independently of the values in the counters 26 and 36. One will thus preferably provide the possibility of deactivating the amplifier 12, the analog-to-digital converter 14, the serial audio interface 16, the digital-to-analog converter 18 and/or the amplifier 20, independently from one another. Each component 12, 14, 16, and 18–20 can for example be put in standby mode by acting directly on an external pin 120, 140, 160, and 180–200. This allows the user of the codec 2 to loop the standby-mode signals 9, 36 generated by the codec onto one or several pins 120 to 200, in order for example to automatically put the serial audio interface 16 in standby mode when the signal 9 is active. It is also possible to provide one or several not-represented registers for defining, through the serial interface controller 38, which components are to be placed in standby mode. This variant embodiment allows the number of outside pins to be limited but does not allow control by wire of the putting in standby mode of the codec's components.

FIG. 3 illustrates diagrammatically the shape of the first standby-mode signal 9 generated by the codec 2 when the analog signal, whose amplitude A is represented on the upper part of the timing diagram, is applied at the input of the amplifier 12. When the codec is switched on, the counter 26 is reinitialized so that the signal 9 is in inactive state, represented here by the logical state 0. The counter 26 is incremented at each sampling time when the digital signal is, in absolute value, lower than the threshold value TH1 in the first register 22, and reinitialized when the digital signal is greater than TH1. The signal 9 at the output of the counter 26 becomes active (represented here by the logical state 1) when the value in the counter is greater than the threshold value TH2 in the register 28. In other terms, the standby mode 9 is activated when the digital input signal is lower than TH1 during TH2 consecutive sampling times.

The counter 26 and the standby-mode signal 9 are reinitialized as soon as the input signal is again greater than TH1 (in absolute value). In order to avoid the influence of parasitic noise, it is also possible, as illustrated in FIG. 3, to provide a delay TH2', preferably lower than TH2, before resetting to zero the counter 26. In other terms, the standby mode is deactivated only if at least TH2' successive samples are greater in absolute value than the threshold value TH1. The value TH2' can also be stored in a register not represented in FIG. 2; the necessary modifications of the codec lie within the abilities of the one skilled in the art.

In a variant embodiment, it is also possible to provide two different threshold values TH1 for activating and deactivating the standby mode 9. This variant embodiment can for example be used by employing a comparator 24 with a hysteresis ("Schmitt comparator").

It will be understood that similar arrangements can be applied to the standby-mode circuit generating the second standby-mode signal 35 from successive values of the digital signal 5. In particular, it is possible to provide, by means of logical elements not-represented, a delay TH4' for reinitializing the counter 34, and different threshold values TH3 for activating and deactivating the standby mode 9 (hysteresis).

The standby-mode signals 9 and 35, in the example described here above, are activated only when a predefined number of successive digital samples is lower than a determined threshold value. It is however possible within the framework of this invention to generate these signals from other characteristics of the digital signal, for example by computing the energy, or the variation of energy, or the power, or the derivative and/or the integral of the digital signal. It is thus possible, at the price of an increased complexity of the system, to detect faster and with a better reliability the presence or absence of significant data in the converted or received digital sequence. Furthermore, an analog and/or digital filtering can be performed in the codec to reduce the influence of noise.

The processor 4 can comprise a computer routine that monitors the state of the two standby-mode signals 9, 35 for selectively activating or deactivating certain components of the system. In a telephony application where, generally, a single partner talks at the time, it is thus possible to deactivate almost at each moment either the acquisition circuit or the restitution circuit and to thus reduce considerably the circuit's electrical consumption.

What is claimed is:

1. An analog-to-digital converter made in the form of a discrete electronic component, comprising:

an analog-to-digital conversion circuit for converting an analog input signal into a sequence of digital samples, an output stage for supplying said sequence in serial form outside said component, and a first signal detection circuit generating a standby output signal, available at a pin of said electronic component, whereby a level of said standby output signal depends on the presence or absence of significant data in said sequence of digital samples.

2. The converter according to claim 1, wherein said first signal detection circuit comprises a first comparator for comparing said digital samples with a first predefined threshold value.

3. The converter according to claim 2, wherein said first threshold value is stored in a first register accessible in writing from outside said component.

4. The converter according to claim 2, wherein said first comparator is a hysteresis comparator.

5. The converter according to claim 1, wherein said first signal detection circuit comprises a first counter whose value is incremented each time a digital sample is lower in absolute value than said first predefined threshold value, wherein said first signal detection circuit indicates an absence of signal when the value in said first counter reaches a second predefined threshold value.

6. The converter according to claim 5, wherein said second predefined threshold value is stored in a second register accessible in writing from outside said component.

7. The converter according to claim 5, wherein said first counter is reinitialized each time a sample is greater in absolute value than said first predefined threshold value.

8. The converter according to claim 7, wherein said first counter is reinitialized each time a predefined number of successive samples is greater in absolute value than said first predefined threshold value.

9. The converter according to claim 5, wherein said value in said first counter is decremented each time a data supplied by said analog-to-digital converter is greater than the first predefined threshold value.

10. The converter according to claim 1, wherein said output stage is put in standby mode based upon the standby output signal.

11. The converter according to claim 1, further comprising:

a digital-to-analog conversion circuit for converting a digital input sequence into an analog sequence, an output stage for supplying outside said component said analog sequence, and a second signal detection circuit for indicating outside said component the presence or absence of significant signal in said analog sequence.

12. The converter according to claim 11, wherein said second signal detection circuit comprises a second comparator for comparing said input sequence with a third predefined threshold value.

13. The converter according to claim 12, wherein said third predefined threshold value is stored in a third register accessible in writing from outside said component.

14. The converter according to claim 12, wherein said second comparator is a hysteresis comparator.

15. The converter according to claim 12, wherein said second signal detection circuit comprises a second counter whose value is incremented each time a data in said digital input sequence is lower than said third threshold value, wherein said second signal detection circuit indicates an absence of signal when the value in said second counter reaches a fourth predefined threshold value.

16. The converter according to claim 15, wherein said fourth predefined threshold value is stored in a fourth register accessible in writing from outside said component.

17. The converter according to claim 15, wherein said second counter is reinitialized each time a data in said digital input sequence is greater than said third predefined threshold value.

18. The converter according to claim 17, wherein said second counter is reinitialized each time a predefined number of successive samples is greater in absolute value than said third predefined threshold value.

19. The converter according to claim 15, wherein said value in said second counter is decremented each time a data in said digital input sequence is greater than said third threshold value.

20. The converter according of claim 11, wherein at least said digital-to-analog conversion circuit is put in standby mode in the absence of significant data in said digital input sequence.

21. The converter according to claim 11, wherein said output stage is put in standby mode in the absence of significant data in said digital input sequence.

22. A digital-to-analog converter made in the form of a discrete electronic component, comprising:
    a digital-to-analog conversion circuit for converting a digital input sequence into an analog sequence,
    an output stage for supplying said analog sequence outside said component, and
    a second signal detection circuit for indicating outside said component the presence or absence of significant data in said analog sequence.

23. The converter according to claim 22, wherein said second signal detection circuit comprises a second comparator for comparing said input sequence with a third predefined threshold value.

24. The converter according to claim 23, wherein said third threshold value is stored in a third register accessible in writing from outside said component.

25. The converter according to claim 23, wherein said second comparator is a hysteresis comparator.

26. The converter according to claim 23, wherein said second signal detection circuit comprises a second counter whose value is incremented each time a data in said digital input sequence is lower than said third predefined threshold value, and wherein said second signal detection circuit indicates an absence of signal when the value in said second counter reaches a fourth predefined threshold value.

27. The converter according to claim 26, wherein said fourth predefined threshold value is stored in a fourth register accessible in writing from outside said component.

28. The converter according to claim 26, wherein said second counter is reinitialized each time a data in said digital input sequence is greater than said third predefined threshold value.

29. The converter according to claim 28, wherein said second counter is reinitialized each time a predefined number of successive samples is greater in absolute value than said third predefined threshold value.

30. The converter according to claim 26, wherein said value in said second counter is decremented each time a digital input data is greater than said second predefined threshold value.

31. The converter according to claim 22, wherein at least said digital-to-analog conversion circuit is put in standby mode in the absence of significant data in said digital input sequence.

32. The converter according to claim 22, wherein said output is put in standby mode in the absence of significant data in said digital input sequence.

33. An acquisition, processing and restitution system for audio data, comprising:
    an analog-to-digital converter, made in the form of a single discrete component, comprising:
    an analog-to-digital conversion circuit for converting an analog input signal into a sequence of digital samples,
    an output stage for supplying said sequence in serial form outside said component, and
    a first signal detection circuit for indicating outside said component the presence or absence of significant data in said sequence,
    a digital-to-analog converter made in the form of a discrete electronic component, comprising:
    a digital-to-analog conversion circuit for converting a digital input sequence into an analog signal,
    an output stage for supplying said analog sequence outside said component, and
    a second signal detection circuit for indicating outside said component the presence or absence of significant data in said sequence,
    a signal processor for processing the sequence of digital samples supplied to or received from said analog-to-digital converter and said digital-to-analog converter, and
    wherein said processor is put in standby mode when said analog-to-digital converter and said digital-to-analog converter indicates an absence of significant data in said sequence.

34. The acquisition system according to claim 33, wherein said analog-to-digital converter and said digital-to-analog converter comprises at least one output pin for a standby-mode signal, said output pin being connected electrically to a physical interrupt input of said processor, said processor comprising a computer module capable of being executed by said processor for detecting any modification of the logical state of the interruption line and for reacting when the latter is at an active level by putting all or part of said system in standby mode.

35. A discrete converter, comprising:
    an analog-to-digital conversion circuit for converting an analog input signal into a sequence of digital samples,
    an output stage for supplying said sequence in serial form outside said component,
    a first signal detection circuit for indicating outside said component the presence or absence of significant data in said sequence, a digital-to-analog conversion circuit for converting an digital input sequence into an analog signal, an output stage for supplying said analog sequence outside said discrete converter, and a second signal detection circuit for indicating outside said discrete converter the presence or absence of significant data in said sequence.

36. Analog-to-digital converter made in the form of a discrete electronic component, comprising:

an analog-to-digital conversion circuit for converting an analog input signal into a sequence of digital samples, an output stage for supplying said sequence in serial form outside said component, a first signal detection circuit for indicating outside said electronic component the presence or absence of significant data in said sequence, wherein said first signal detection circuit comprises a first comparator for comparing said digital samples with a first predefined threshold value, said threshold value being stored in a first register accessible in writing from outside said component, and a first counter whose value is incremented each time a digital sample is lower in absolute value than said first threshold value, an indication of absence of signal being generated when the value in said first counter reaches a second predefined threshold value.

37. The converter of claim 36, wherein said second predefined threshold value is stored in a second register accessible in writing from outside said component.

38. The converter of claim 36, wherein said first counter is reinitialized each time a sample is greater in absolute value than said first predefined threshold value.

39. The converter of claim 38, wherein said first counter is reinitialized each time a predefined number of successive samples is greater in absolute value than said first predefined threshold value.

40. The converter of claim 36, wherein said value in said first counter is decremented each time a data supplied by said analog-to-digital converter is greater than the first predefined threshold value.

41. Analog-to-digital converter made in the form of a discrete electronic component, comprising:

an analog-to-digital conversion circuit for converting an analog input signal into a sequence of digital samples, an output stage for supplying said sequence in serial form outside said component, a first signal detection circuit for indicating outside said electronic component the presence or absence of significant data in said analog input signal, a digital-to-analog conversion circuit for converting a digital input sequence into an analog sequence, an output stage for supplying outside said component said analog signal, a second signal detection circuit for indicating outside said component the presence or absence of significant signal in said digital input sequence.

42. The converter of claim 41, wherein said second signal detection circuit comprises a second comparator for comparing said input sequence with a third predefined threshold value.

43. The converter of claim 42, wherein said third predefined threshold value is stored in a third register accessible in writing from outside said component.

44. The converter of claim 42, wherein said second comparator is a hysteresis comparator.

45. The converter of claim 42, wherein said signal detection circuit comprises a second counter whose value is incremented each time a data in said digital input sequence is lower than said third predefined threshold value, an indication of absence of signal being generated when the value in said second counter reaches a fourth predefined threshold.

46. The converter of claim 45, wherein said fourth threshold value is stored in a fourth register accessible in writing from outside said component.

47. The converter of claim 45, wherein said second counter is reinitialized each time a data in said digital input sequence is greater than said third predefined threshold value.

48. The converter of claim 47, wherein said second counter is reinitialized each time a predefined number of successive samples is greater in absolute value than said third predefined threshold value.

49. The converter of claim 45, wherein said value in said second counter is decremented each time a data in said digital input sequence is greater than said third predefined threshold value.

50. The converter of claim 41, wherein at least said digital-to-analog conversion circuit is put in standby mode in the absence of significant data in said digital input sequence.

51. The converter of claim 41, said output stage being put in standby mode in the absence of significant data in said digital input sequence.

* * * * *